United States Patent [19]
Cromwell

[11] Patent Number: 5,926,370
[45] Date of Patent: Jul. 20, 1999

[54] METHOD AND APPARATUS FOR A MODULAR INTEGRATED APPARATUS FOR MULTI-FUNCTION COMPONENTS

[75] Inventor: S. Daniel Cromwell, Roseville, Calif.

[73] Assignee: Hewlett-Packard Company, Palo Alto, Calif.

[21] Appl. No.: 09/182,939

[22] Filed: Oct. 29, 1998

[51] Int. Cl.$^6$ ..................................................... H05K 7/20
[52] U.S. Cl. .......................... 361/700; 361/687; 361/699; 361/700; 361/818; 165/80.3; 165/80.4; 165/185; 257/704; 257/713; 257/723
[58] Field of Search ................................... 361/683, 685, 361/687, 699, 695, 697, 676, 700, 818, 829; 257/713, 715, 714, 700, 707, 723, 683, 704; 165/80.2, 80.3, 80.4, 104.21, 104.14, 104.33

[56] References Cited

U.S. PATENT DOCUMENTS 4,067,237  1/1978  Arcella .
4,120,019  10/1978  Arii et al. .

(List continued on next page.)

OTHER PUBLICATIONS

HP PDNO: 10970218, "A Heat Sink And Faraday Cage Assembly For A Semiconductor Module And A Power Converter," Filed: Jul. 30, 1997, Serial No. 08/902,770, pp. 1–17, Figs. 1–6.
HP PDNO: 10970583–1, "Perimeter Clamp For Mounting and Aligning A Semiconductor Component As Part Of A Field Replaceable Unit (FRU)," Filed Feb. 27, 1998, Serial No. 09/032,359, pp. 1–27, Figs. 1–5.
"Chomerics—The EMI Shielding/Thermal Management Resource Center," (visited Oct. 29, 1998) <http://www.chomerics.com>.
MASCO Electronics—Spira, "Inspiration—The Better EMI Gasket," (visited Oct. 29, 1998) <http://www.masco–electronics.com/spira.shtm>p. 1 of 1.
"Thermstrate High Efficiency Thermal", (visited Nov. 9, 1998) <http://www.powerdevices.com>pp. 1–2.
Texas Instruments (visited Nov. 6, 1998) <http://www.ti-.com./mc/docs/igb/docs/lga.htm>p. 1.
Thomas & Betts Corporation (visited Nov. 6, 1998) <http://www.businesswire.com/cnn/tnb.htm>pp. 1–3.
S.A. Curtis, et al., "Surface Mount Chip Packaging", IBM Technical Disclosure Bulletin, vol. 28–No. 12, May 1986, pp. 5531–5532.
S.W. Lee, et al., "Low Profile Heat Sink", IBM Technical Disclosure Bulletin, vol. 28–No. 12, May 1986, pp. 5172–5173.
F.J. DeMaine, et al., "Attachable Heat Sink For Pluggable Modules", IBM Technical Disclousre Bulletin, vol. 22–No. 3, Aug. 1979, pp. 960–961.
HP PDNO: 10970218, "A Heat Sink And Faraday Cage Assembly For A Semiconductor Module And A Power Converter." Filed: Jul. 30, 1997, Serial No. 08/902,770, pp. 1–17, Figs. 1–6.
HP PDNO: 10970583–1, "Perimeter Clamp For Mounting and Aligning A Semiconductor Component As Part Of A Field Replaceable Unit (FRUI)," Filed Feb. 27, 1998, Serial No. 09/032,359, pp. 1–27, Figs. 1–5.
HP PDNO: 10971839, "Method and Apparatus For Modular Integrated Apparatus For Heat Dissipation." Filed: Nov. 18, 1998, Ser. No. 09/195256, pp. 1–27, Figs. 1–4.

*Primary Examiner*—Leo P. Picard
*Assistant Examiner*—Michael Datskousky

[57] ABSTRACT

A modular integrated computer apparatus that includes a CPU or VLSI module connected to a printed circuit board, a power converter, and one or more associated electric power cables; and is a supporting infrastructure that ensures ease of use. The field replaceable apparatus may also function as an EMI enclosure and a heat management device. The field replaceable apparatus may be inserted and removed from a computer system by handles that are attached to the modular integrated apparatus. The installed field replaceable apparatus is positioned to ensure that the CPU module is properly connected to the printed circuit board.

29 Claims, 5 Drawing Sheets

U.S. PATENT DOCUMENTS

| | | |
|---|---|---|
| 4,167,031 | 9/1979 | Patel . |
| 4,342,069 | 7/1982 | Link . |
| 4,376,560 | 3/1983 | Olsson et al. . |
| 4,506,938 | 3/1985 | Madden . |
| 4,540,226 | 9/1985 | Thompson et al. . |
| 4,563,383 | 1/1986 | Kuneman et al. . |
| 4,589,716 | 5/1986 | Williams . |
| 4,638,854 | 1/1987 | Noren . |
| 4,675,783 | 6/1987 | Murase et al. . |
| 4,707,726 | 11/1987 | Tinder . |
| 4,829,432 | 5/1989 | Hershberger et al. . |
| 4,858,093 | 8/1989 | Sturgeon . |
| 4,874,318 | 10/1989 | Spencer . |
| 4,951,740 | 8/1990 | Peterson et al. . |
| 4,961,633 | 10/1990 | Ibrahim et al. . |
| 4,975,825 | 12/1990 | Huss et al. . |
| 4,978,638 | 12/1990 | Buller et al. . |
| 5,010,292 | 4/1991 | Lyle, Jr. . |
| 5,060,112 | 10/1991 | Cocconi . |
| 5,078,622 | 1/1992 | Hunt et al. . |
| 5,118,925 | 6/1992 | Mims et al. . |
| 5,131,859 | 7/1992 | Bowen et al. . |
| 5,136,119 | 8/1992 | Leyland . |
| 5,162,974 | 11/1992 | Currie . |
| 5,208,731 | 5/1993 | Blomquist . |
| 5,229,915 | 7/1993 | Ishibashi et al. . |
| 5,276,585 | 1/1994 | Smithers . |
| 5,307,239 | 4/1994 | McCarty et al. . |
| 5,311,395 | 5/1994 | McGaha et al. . |
| 5,311,397 | 5/1994 | Harshberger et al. . |
| 5,313,099 | 5/1994 | Tata et al. . |
| 5,329,426 | 7/1994 | Villani . |
| 5,339,214 | 8/1994 | Nelson . |
| 5,359,493 | 10/1994 | Chiu . |
| 5,359,768 | 11/1994 | Haley . |
| 5,367,193 | 11/1994 | Malladi . |
| 5,386,338 | 1/1995 | Jordan et al. . |
| 5,387,554 | 2/1995 | Liang . |
| 5,394,607 | 3/1995 | Chiu et al. . |
| 5,398,822 | 3/1995 | McCarthy et al. . |
| 5,428,897 | 7/1995 | Jordan et al. . |
| 5,436,800 | 7/1995 | Maruska et al. . |
| 5,442,234 | 8/1995 | Liang . |
| 5,460,571 | 10/1995 | Kato et al. . |
| 5,461,541 | 10/1995 | Wentland, Jr. et al. . |
| 5,461,766 | 10/1995 | Burward-Hoy . |
| 5,475,606 | 12/1995 | Muyshondt et al. . |
| 5,487,673 | 1/1996 | Hurtarte . |
| 5,502,622 | 3/1996 | Cromwell . |
| 5,504,650 | 4/1996 | Katsui et al. . |
| 5,506,758 | 4/1996 | Cromwell . |
| 5,508,908 | 4/1996 | Kazama et al. . |
| 5,513,070 | 4/1996 | Xie et al. . |
| 5,522,602 | 6/1996 | Kaplo et al. . |
| 5,558,522 | 9/1996 | Dent . |
| 5,579,827 | 12/1996 | Chung . |
| 5,586,005 | 12/1996 | Cipolla et al. . |
| 5,587,883 | 12/1996 | Olson et al. . |
| 5,587,920 | 12/1996 | Muyshondt et al. . |
| 5,592,366 | 1/1997 | Goldman et al. . |
| 5,592,391 | 1/1997 | Muyshondt et al. . |
| 5,598,320 | 1/1997 | Toedtman et al. . |
| 5,621,635 | 4/1997 | Takiar . |
| 5,640,304 | 6/1997 | Hellinga et al. . |
| 5,641,995 | 6/1997 | Sloma et al. . |
| 5,722,839 | 3/1998 | Yeh . |
| 5,766,031 | 6/1998 | Yeh . |
| 5,870,284 | 2/1999 | Stewart et al. ............................ 361/699 |

METHOD AND APPARATUS FOR A MODULAR INTEGRATED APPARATUS FOR MULTI-FUNCTION COMPONENTS

FIELD OF THE INVENTION

The present invention relates generally to a method and apparatus for packaging a computer system. More particularly, the present invention relates to a modular integrated apparatus that combines a CPU, a power converter, the associated power cables, and a printed circuit board into a system package that also functions as an EMI containment enclosure and a heat management device.

DESCRIPTION OF RELATED ART

The following applications are related to the present application: U.S. patent application entitled, "A HEAT SINK AND FARADAY CAGE ASSEMBLY FOR A SEMICONDUCTOR MODULE AND A POWER CONVERTER," Ser. No. 08/902,770, naming inventor S. Daniel Cromwell, assigned to the assignee of the present invention; and U.S. patent application entitled, "PERIMETER CLAMP FOR MOUNTING AND ALIGNING A SEMICONDUCTOR COMPONENT AS PART OF A FIELD REPLACEABLE UNIT (FRU)" Ser. No. 09/032359, naming inventor S. Daniel Cromwell, assigned to the assignee of the present invention.

The following patents are related to the present application: U.S. Pat. No. 5,506,758 entitled, "CIRCUIT BOARD INSERTER AND EXTRACTOR," naming inventor S. Daniel Cromwell, assigned to the assignee of the present invention; and U.S. Pat. No. 5,502,622 entitled, "RETENTION CLIP TO MOUNT A HANDLE TO A CIRCUIT BOARD," naming inventor S. Daniel Cromwell, assigned to the assignee of the present invention.

BACKGROUND OF THE INVENTION

The computer industry continues to use smaller components and subassemblies that are easy-to-use, that have low manufacturing costs, and that have low maintenance and repair costs. In the past the movement to smaller computer systems and subassemblies has prompted the use of systems having functionality that is designed into a self-contained module, such as a power supply that may be plugged directly into a printed circuit board. This procedure has also been used for DC-to-DC power converters such as those converting primary power into power for CPU modules. Further, the use of functionality that is designed into a self-contained module has been used for other VLSI components, such as CPU processors. It will be understood that further reference to a CPU module may include other forms of VLSI components and that reference to a printed circuit board may include a computer system board such as a mother board.

The integration of self-contained computer system modules has not progressed to include both electrical and mechanical functionality in a multi-function, easy-to-use module that can be replaced in the field. For instance, both the CPU module and the power converter continue be treated as separate units for electrical and mechanical functionality. This has created problems, such as requiring separate parts, thus resulting in high costs for parts, assembly, repair, and upgrade.

Further, maintaining separate units for a CPU module and a power converter requires significant printed circuit board space since both modules require separate access during assembly and repair. This has resulted in large and expensive printed circuit boards with long bus lengths. Long bus lengths further result in degraded system performance due to an increase in the transit time on a long bus.

The mechanical alignment of separate parts has complicated the process of properly connecting the CPU module to the printed circuit board. Additionally, inserting a CPU module on a printed circuit board often requires a tool, such as a press, to overcome the insertion force; and a costly extraction tool is often required to remove a CPU module for replacement or repair.

The CPU module and the power converter are electrical components that require shielding from electromagnetic (EMI) or radio frequency (RFI) interferences which they may generate. Hereinafter EMI and RFI will be referred to collectively as "EMI." A Faraday Cage solution to the EMI problem is an enclosure which attenuates EMI and may permit air flow for dissipation of heat. Treating the CPU module and the power converter as separate modules requires separate associated EMI containment components and limits the ability to reduce the time required for certain manufacturing and repair tasks associated with these components. Further, the separate EMI containment components have introduced the risk of lower system quality due to the difficulty of assembly and repair of additional components in computer systems and subassemblies.

As the state of development of semiconductor components has moved to increased levels of integration, the amount of heat these devices generate has significantly increased thereby raising the risk of heat damage to the computer components. In the past, the difficult job of dealing with the sensitive and critical thermal interface between the CPU module and the power converter, and their respective heat sink components has been handled separately. It will be appreciated that heat management may also be required to raise the temperature of components in a computer system to a level required for proper operation. The separate approach to the heat management process increases the complexity of a computer system due to the need for additional system components, and thereby adversely impacts cost, and time to manufacture and repair. There is also a risk of quality problems associated with increased system complexity. It will be appreciated that "heat sink" and "heat management device" will be used interchangeably herein.

Accordingly, it is an object of the present invention to provide a computer apparatus and method that treat a CPU module, a power converter, and associated power connectors together in an integrated apparatus that can be easily and properly installed and removed from a computer system in the field.

It is an object of the invention to provide a receiving unit that includes a printed circuit board and that enables proper connection of the CPU module to the printed circuit board.

Another object of the present invention is to provide a technique for installing and removing a CPU module, a power converter, and the associated power connectors, all in an integrated package without the aid of auxiliary hand tools.

Another object of the present invention is to provide a means for orienting a field replaceable apparatus in a computer system to properly interface to a printed circuit board in a computer system.

Another object of the present invention is to provide a modular integrated apparatus that also is an EMI enclosure and a heat management device.

Another object of the present invention is to provide a field replaceable apparatus that is assembled and tested prior to installation in the field.

It is yet another object of the present invention to minimize the number of parts required to provide the features of ease of installation, EMI containment, and heat management and thereby improve the repair and upgrade process, even at a customer site.

SUMMARY OF THE INVENTION

The present invention may be implemented as a modular integrated apparatus for a computer system that includes a field replaceable apparatus and a receiving apparatus, and may also function as a heat management device and a Faraday Cage. The field replaceable apparatus may be installed, removed, and handled outside of the manufacturing environment. The field replaceable apparatus includes a CPU module, a power converter, and associated electric power cables, and establishes connection to the receiving apparatus thereby ensuring proper connection of the CPU module to a printed circuit board. The field replaceable apparatus may include insertion-extraction handles, such as levers, that aid in inserting and removing the field replaceable apparatus without additional tools.

The field replaceable apparatus may be implemented having an alignment frame that includes an alignment flange. It will be appreciated that alignment of components in the computer system may require multiple levels of alignment functionality. For instance, the alignment frame includes a coarse alignment functionality, which ensures that the alignment flange is located in a pre-determined position to properly position the alignment frame with respect to the computer system. Coarse alignment functionality controls orientation and position during the process of connecting the field replaceable apparatus to the printed circuit board. More particularly, the computer system may include a chassis and the pre-determined location of the alignment flange properly positions the alignment frame and facilitates installation and removal of the alignment frame from the chassis. Precise alignment functionality ensures that components of the receiving apparatus and the field replaceable apparatus are properly oriented and positioned to ensure the field replaceable apparatus is properly connected to the receiving apparatus. Further, the precise alignment functionality ensures that the alignment flange, the field replaceable apparatus, and the receiving apparatus are positioned to properly connect the CPU module to the printed circuit board. Therefore, the modular integrated apparatus includes both coarse and precise alignment functionality. The coarse alignment functionality ensures that the precise alignment functionality operates, and the precise alignment functionality ensures that the CPU module is properly connected to the printed circuit board. The alignment frame may also provide structure and support for elements of the field replaceable apparatus such as elements of the heat dissipation device.

The receiving apparatus may include a CPU module sleeve and the printed circuit board. The receiving apparatus may be attached to the computer chassis and thereby enable coarse alignment functionality by ensuring that the modular integrated apparatus is properly aligned in the computer system. The receiving apparatus also enables precise alignment functionality by properly placing the CPU module sleeve and the printed circuit board to receive the field replaceable apparatus thereby ensuring proper connection of the CPU module to the printed circuit board.

The alignment frame of the field replaceable apparatus may include a top plate, a pair of alignment brackets, and an alignment rim. In one embodiment, the top plate of the alignment frame may be a heat fin, thus advantageously reusing the heat fin as an element of the alignment frame. The alignment brackets may be symmetrical and may sandwich the alignment rim and thereby form the alignment flange.

The field replaceable apparatus may also function as a heat management device and may include an isothermal layer such as an isothermal plate that is sandwiched between the CPU module and the power converter. The CPU module is located on the isothermal plate at a pre-determined location that ensures proper precise alignment and orientation to the printed circuit board, and thereby ensures proper connection of the CPU module on the printed circuit board. Further, the isothermal plate is properly oriented and positioned with regard to the alignment frame to ensure proper precise alignment and orientation to the receiving apparatus. By including a slot in the isothermal plate, a passageway is created for connectors that transmit both the primary power from the printed circuit board to the power converter, and power transformed by the power converter for use by the CPU module.

Further, the field replaceable apparatus may include at least one heat pipe that, by means well known in the art, thermally communicates with the isothermal plate to divert heat for more efficient heat management. It will be appreciated that the heat management device may direct heat away from or toward computer components to maintain their proper operating temperatures. Also, the field replaceable apparatus may include at least one heat fin that is located adjacent to the power converter and the isothermal plate, thereby enabling the heat fin to dissipate heat originating from the power converter, the CPU module, and the associated cables.

The modular integrated apparatus may also form a Faraday Cage that shields EMI from the CPU module, the power converter, and the associated power cables. The Faraday Cage may include the isothermal plate having the slot, the alignment frame, an EMI sleeve, the CPU module sleeve, and the printed circuit board. By using elements that have other purposes, such as the isothermal plate, the alignment frame, and the printed circuit board; the field replaceable apparatus efficiently uses space and also maintains EMI shielding.

Additionally, the modular integrated apparatus may have anchor fasteners, such as anchor screws, that securely fasten the elements of the field replaceable apparatus together. The alignment frame may also have at least one EMI screw that connects to the pair of alignment brackets and thereby tightens the alignment brackets to create a suitable Faraday Cage.

The present invention may be implemented as a method of creating a modular integrated apparatus as described above. The method may include creating an alignment frame and the apparatus may also function as an EMI enclosure and a heat management device.

One embodiment of the present invention may be implemented as an easy-to-use, modular integrated apparatus that includes a CPU module connected to a printed circuit board, a power converter, and associated electric power cables, and that is an EMI enclosure and a heat management device. Further, the difficult task of properly connecting the CPU module and the printed circuit board is accomplished by employing the alignment features of the modular integrated apparatus.

Other aspects and advantages of the present invention will become apparent from the following detailed description, taken in conjunction with the accompanying drawings, illustrating by way of example the principles of the present invention.

DETAILED DESCRIPTION

Figure 1:
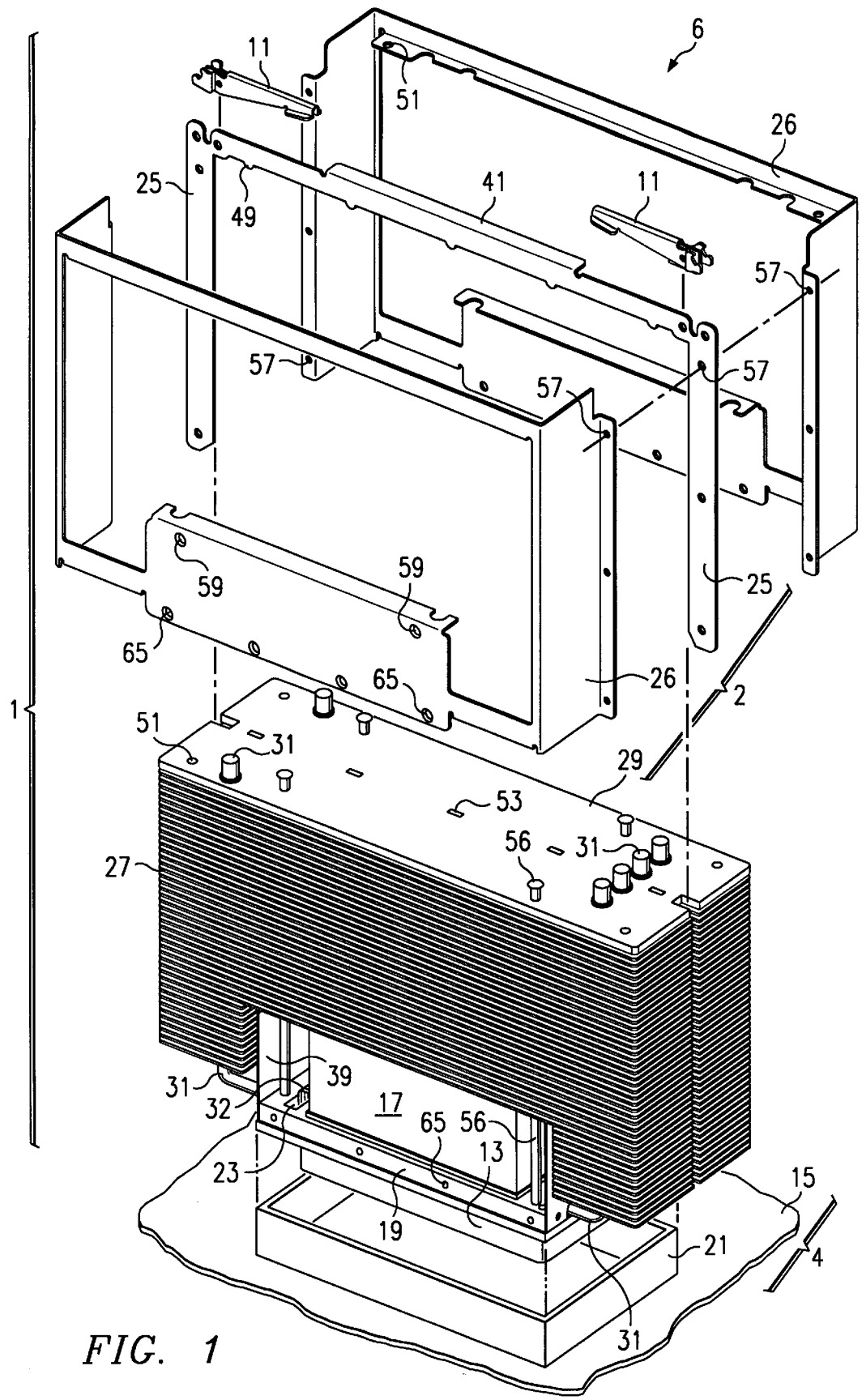
FIG. 1 is a view of the modular integrated apparatus according to one aspect of the invention.

In the following detailed description and in the several figures of the drawings, like elements are identified with like reference numerals.

Broadly stated, FIG. 1 illustrates a modular integrated apparatus 6 for a computer system that includes a CPU module 13 that is connected to a printed circuit board 15, a power converter 17, and associated electric power connectors 32 in an easy-to-use package that also functions as an EMI containment enclosure and a heat management device. The multifunction modular integrated apparatus 6 reduces the number of parts required in the easy-to-use package that may be installed and removed even at a customer site. Further, the modular integrated apparatus 6 is intended to be used in a computer system having primary electric power and a metal chassis (not shown in the drawings).

In the present embodiment, the modular integrated apparatus 6 includes a field replaceable apparatus 1 and a receiving apparatus 4. The field replaceable apparatus 1 includes the CPU module 13, the power converter 17, the associated electric power connectors 32, an isothermal plate 19, a plurality of heat fins 27, a plurality of heat pipes 31, and an alignment frame 2. Further, the field replaceable apparatus 1 is located and positioned to connect to the receiving apparatus 4.

In the present embodiment, the receiving apparatus 4 includes the printed circuit board 15 that is attached to a CPU module sleeve 21, and may be connected to elements of the computer system such as the chassis. When the receiving apparatus 4 and the field replaceable apparatus 1 are connected, they form the modular integrated apparatus 6. Further, when the modular integrated apparatus 6 is formed, the CPU module sleeve 21 circumscribes and is adjacent to the CPU module 13, thereby connecting the CPU module 13 to the printed circuit board 15. That is, the interface between the CPU module sleeve 21 to the CPU module 13, locates the CPU module 13 for proper connection to the printed circuit board 15.

The CPU module sleeve 21 also helps support the field replaceable apparatus 1 and distributes the weight load created on the printed circuit board 15 by the connection of the field replaceable apparatus 1 and the receiving apparatus 4. The CPU module sleeve 21 also attenuates EMI as is discussed with reference to FIG. 4c. The CPU module sleeve 21 is related to the invention disclosed in U.S. patent application Ser. No. 09/032359.

The field replaceable apparatus 1 also includes an isothermal plate 19 that is sandwiched between the CPU module 13 and the power converter 17. The isothermal plate 19 includes a slot 23 that acts as a passageway for electric power connectors 32, such as an input electric power cable that transmits electric power between the printed circuit board 15 and the power converter 17, and an output power cable that transmits power between the power converter 17 and the CPU module 13. By means of example, the power converter 17 may transform 48 volts to between 1.5 and 2.0 volts of power for use by the CPU module 13.

The field replaceable apparatus 1 may also form a heat management device such as a heat sink assembly 18 that is discussed with reference to FIG. 4b. In the present embodiment, the isothermal plate 19 is connected to and thermally communicates with the heat pipes 31. Thereby, the heat pipes 31 divert heat from the CPU module 13, the power converter 17, and the associated power connectors 32 by conducting heat to a space where there is sufficient air flow to cool the system. Further, the isothermal plate 19 and power converter 17 may be flanked by the heat fins 27 that dissipate heat by convection to the surrounding air. The heat fins 27 dissipate heat from the power converter 17, the CPU module 13, and the associated power connectors 32.

The thickness of any part of the modular integrated apparatus 6 may be determined by techniques well known in the art, and in the present embodiment the field replaceable apparatus 1 is in part a metallic alloy. The field replaceable apparatus 1 may also form a Faraday Cage 34, which is discussed in more detail with reference to FIG. 4c.

The field replaceable apparatus 1 may include the alignment frame 2 that properly locates the field replaceable apparatus 1 in the computer system and ensures both coarse and precise alignment functionality. The primary purpose of both coarse and precise alignment functionality is to ensure proper connection of the CPU module 13 to the printed circuit board 15.

Figure 2A:
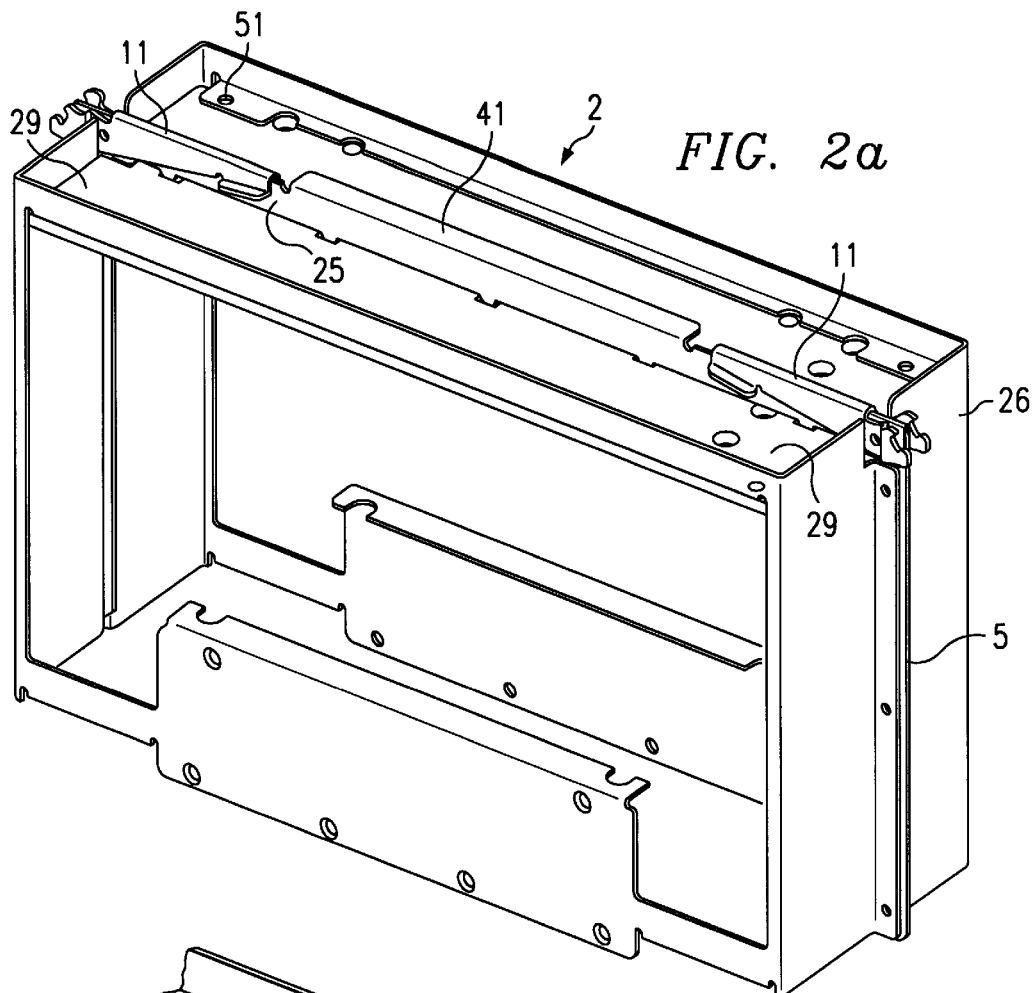
FIG. 2a is a perspective view of the alignment frame.

In the present embodiment, the alignment frame 2 includes a top plate 29, a pair of alignment brackets 26 that may be symmetrical and located on opposite sides of the field replaceable apparatus 1, and an alignment rim 25. More particularly, when assembled as is shown in FIG. 2a, the alignment brackets 26 and the alignment rim 25 form an alignment flange 5, which functions as a guide to position the alignment frame 2 with respect to the computer system. Also, the alignment frame 2 provides support for members of the field replaceable apparatus 1 such as the heat pipes 31 and the heat fins 27.

With further reference to FIG. 1, the pair of alignment brackets 26 and the alignment rim 25 are secured by flange screws (not shown) that insert into flange sockets 57 that are spaced along the alignment flange 5 as shown. The flange sockets 57 may be tapped by techniques such as threading sockets or nuts (not shown). It will be appreciated that the use of screws and sockets may be substituted by a variety of other attachment techniques that are well-known in the art.

The present embodiment of the alignment rim 25 is an inverted U-shape and may be metal. The alignment rim 25 may circumscribe an axis along the center of the field replaceable apparatus 1 and thereby define two lengthwise portions of the apparatus that begin at the top of the apparatus in the orientation depicted in FIG. 2a and extend through the bottom of the apparatus. The alignment rim 25 also includes a handle 41 fixedly located on its top side that aids manipulation of both the alignment rim 25 and the field replaceable apparatus 1 during assembly, removal, or other handling. In the present embodiment, the handle 41 is formed by bending the top of the alignment rim 25 at about 90 degrees to form a lip that can be easily grasped.

The alignment rim 25 also includes a plurality of tabs 49, as shown in FIG. 1, that fit into a plurality of notches 53, such as a slot or groove, in the top plate 29 thereby aligning the alignment rim 25 with the top plate 29. In the present embodiment, the tabs 49 geometrically align with the notches 53. It will be appreciated that the top plate 29 may be the upper-most heat fin 27 which is made of thicker metal than the other heat fins 27.

In the present embodiment, the alignment brackets 26 are also attached to the top plate 29 by top plate screws (not shown) that fit into top plate sockets 51 located in the top plate 29 and in each of the alignment brackets 26. Thereby, mechanical stress on the heat fins 27 and the heat pipes 31 is minimized. Additionally, the attachment of the top plate screws helps square the field replaceable apparatus 1.

The alignment brackets 26 are also attached to the isothermal plate 19 by alignment frame attachment screws (not shown) that fit in alignment frame sockets 65 in both the isothermal plate 19 and the alignment brackets 26. One embodiment also includes a plurality of anchor screws 56 that are inserted into the top plate 29, through the heat fins 27 and the isothermal plate 19, and into the CPU module sleeve 21; and that attach the field replaceable apparatus 1 to the printed circuit board 15. The attachment of the anchor screws 56 ensures proper electrical, mechanical, and EMI management of the modular integrated apparatus 6 by securing the field replaceable apparatus 1 to the receiving apparatus 4. In an alternative embodiment, the anchor screws 56 may be attached directly to the printed circuit board 15 in place of the attachment to the CPU module sleeve 21, and are described in greater detail with reference to FIG. 4a.

Figure 4B:
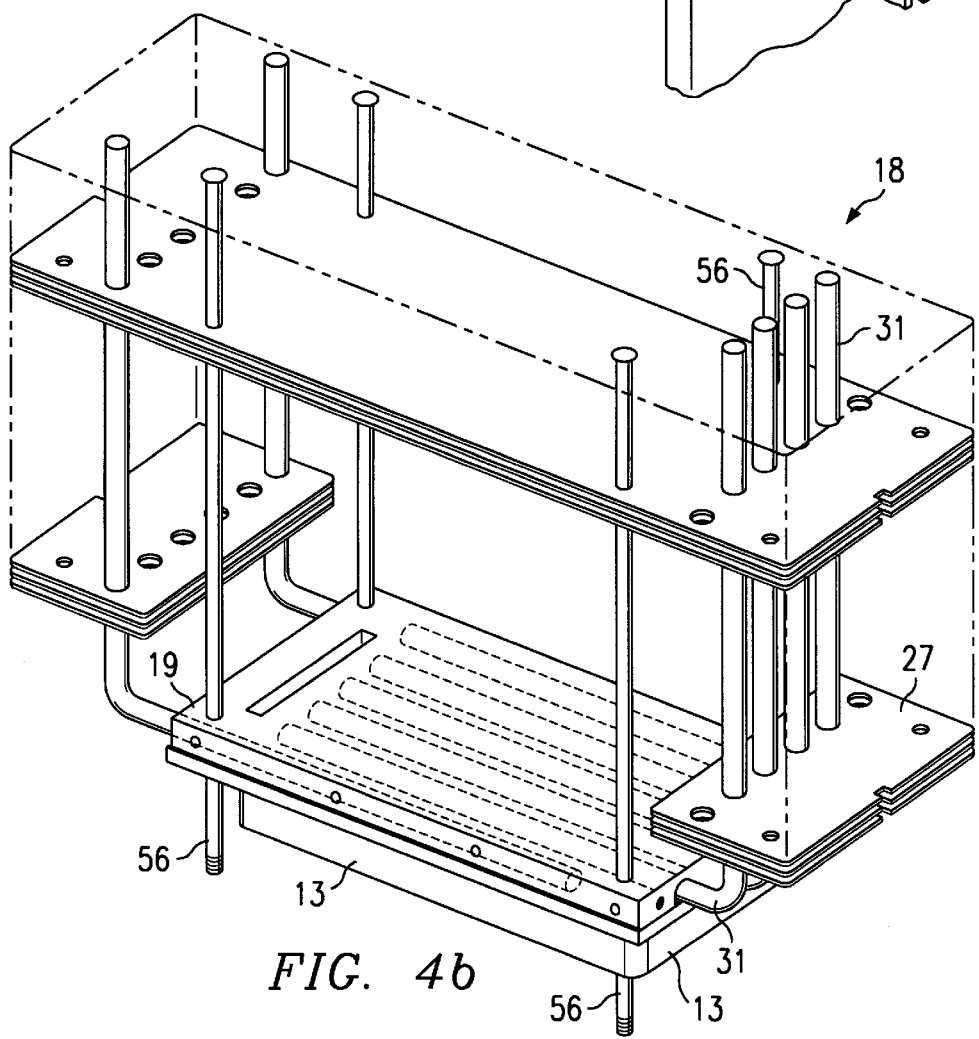
FIG. 4b is a perspective view of the heat sink.
Figure 4A:
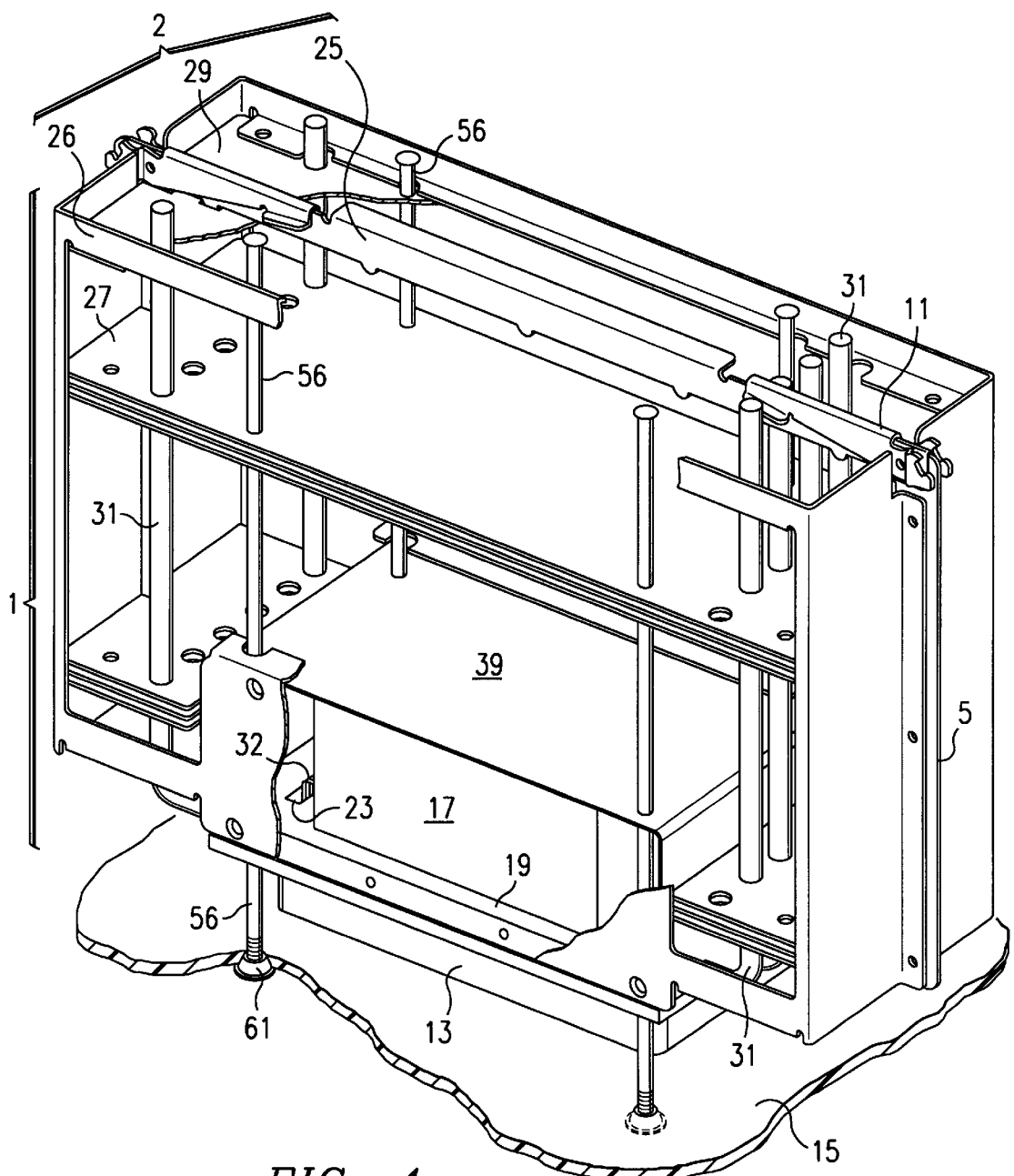
FIG. 4a is a transparent view of the field replaceable apparatus and the printed circuit board according to one aspect of the invention.
Figure 4C:
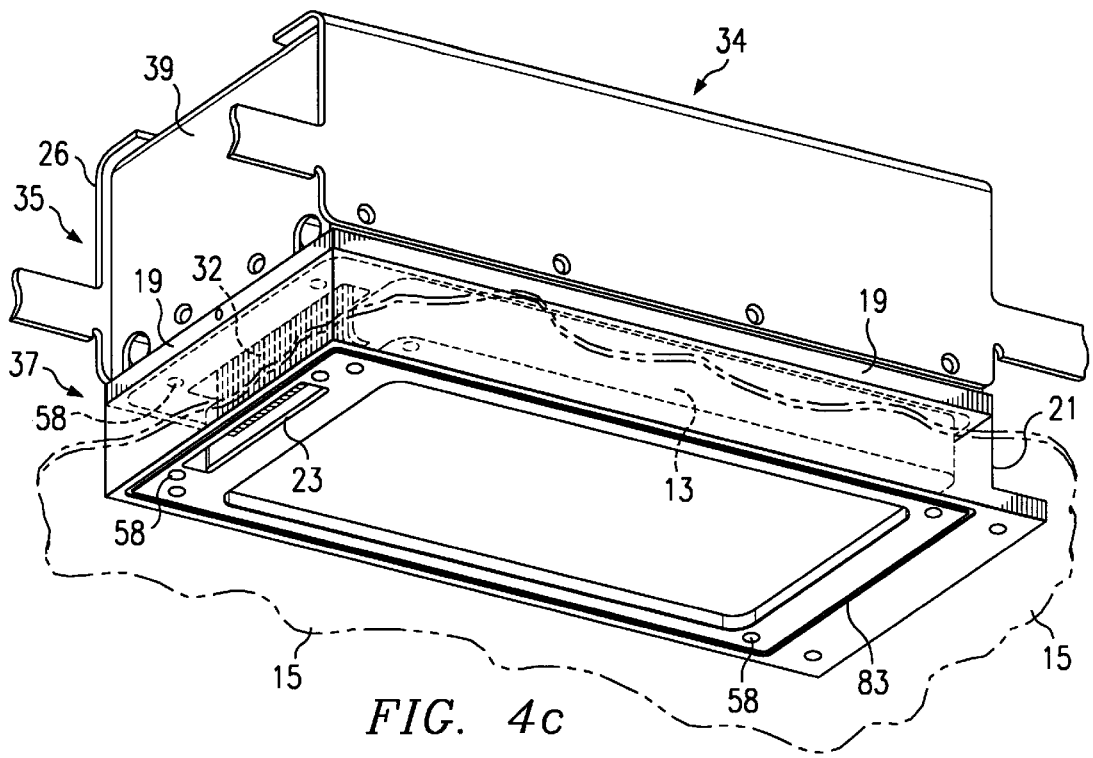
FIG. 4c is a cutaway perspective view of the Faraday Cage.

The pair of alignment brackets 26 also form members of a Faraday Cage 34 (as shown in FIG. 4c) and may be secured by EMI screws (not shown) that fit into EMI sockets 59 that are symmetrically aligned on the pair of alignment brackets 26. The EMI screw may be secured by threading it into a nut (not shown). By fitting the EMI screw into one EMI socket 59 and securing the EMI screw into the symmetrical EMI socket 59 on the other alignment bracket 26, the alignment brackets 26 are tightened and compressed against open edges of an EMI sleeve 39 and thereby create a Faraday Cage 34.

Further, the field replaceable apparatus 1 may include insertion-extraction handles 11 that interlock with a clip (not shown) to guide, position, and stabilize the placement of the alignment frame 2 in the computer system. In the present embodiment, the insertion-extraction handles 11 are mechanically attached to the alignment rim 25, which are more fully discussed with reference to FIG. 3, and are related to the invention disclosed in U.S. Pat. Nos. 5,506,758 and 5,502,622.

FIG. 2a shows an assembled perspective view of one embodiment of the alignment frame 2. The pair of alignment brackets 26 sandwich the alignment rim 25 and thereby form the alignment flange 5. Both the pair of alignment brackets 26 and the top plate 29 include the top plate sockets 51. The alignment rim 25 includes the handle 41 that is bent from the alignment rim 25, and the insertion-extraction handles 11 are attached to the alignment rim 25.

The alignment flange 5 is positioned on the alignment frame 2 in a pre-determined position to orient the field replaceable apparatus 1 with respect to the computer system thereby ensuring both coarse and precise alignment functionality. The alignment flange 5 protrudes on two opposite sides of the alignment frame 2 and fits into guides in the computer system, such as computer chassis guides (not shown). In the present embodiment, when the alignment frame 2 fits properly in the chassis guides the power converter 17 connects to the primary electric power through the printed circuit board 15, and the CPU module 13 is properly connected to the printed circuit board 15 (as are shown in FIG. 1).

The chassis guide may be a ledge with grooves that fit the width of the sliding alignment flange 5. Alternatively, the chassis guides may be individual units, such as separate grooves that incrementally capture the alignment flange 5 and thereby direct the insertion and removal of the alignment frame 2 in the computer system. The chassis guides may be made with sheet metal and may be formed as part of the chassis wall. In an alternative embodiment, the chassis guides may be made of molded plastic or may be snapped into the walls of the chassis. Plastic chassis guides may be advantageous if electrical insulation is required to eliminate arcing of individual electrical members on the printed circuit board 15. Chassis guides formed from metal may enhance the EMI features of the alignment frame 2.

Figure 2B:
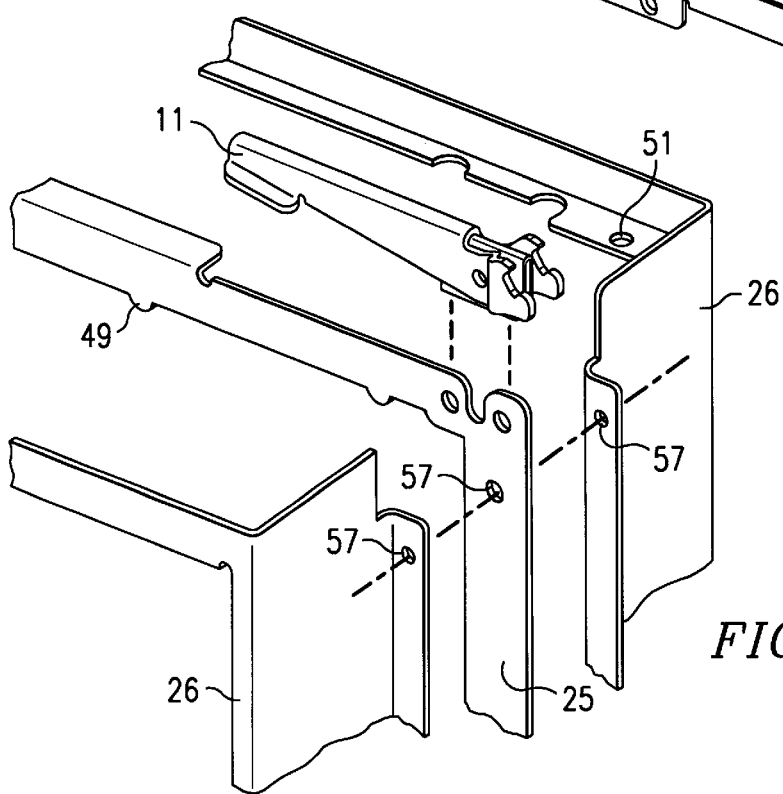
FIG. 2b is an enlarged and exploded view of the upper corner portion of the alignment brackets and the alignment rim.

FIG. 2b shows an enlarged and exploded view of the upper portion of the alignment brackets 26 and the alignment rim 25. The alignment flange screws fit into the flange sockets 57 on the alignment brackets 26 and the alignment rim 25, and thereby form the alignment flange 5 (as shown in FIG. 2a). Both the alignment brackets 26 and the top plate 29 (as shown in FIG. 2a) include the top plate sockets 51 that secure the top plate 29 to the pair of alignment brackets 26. The insertion-extraction handles 11 are attached to the alignment rim 25.

Figure 3:
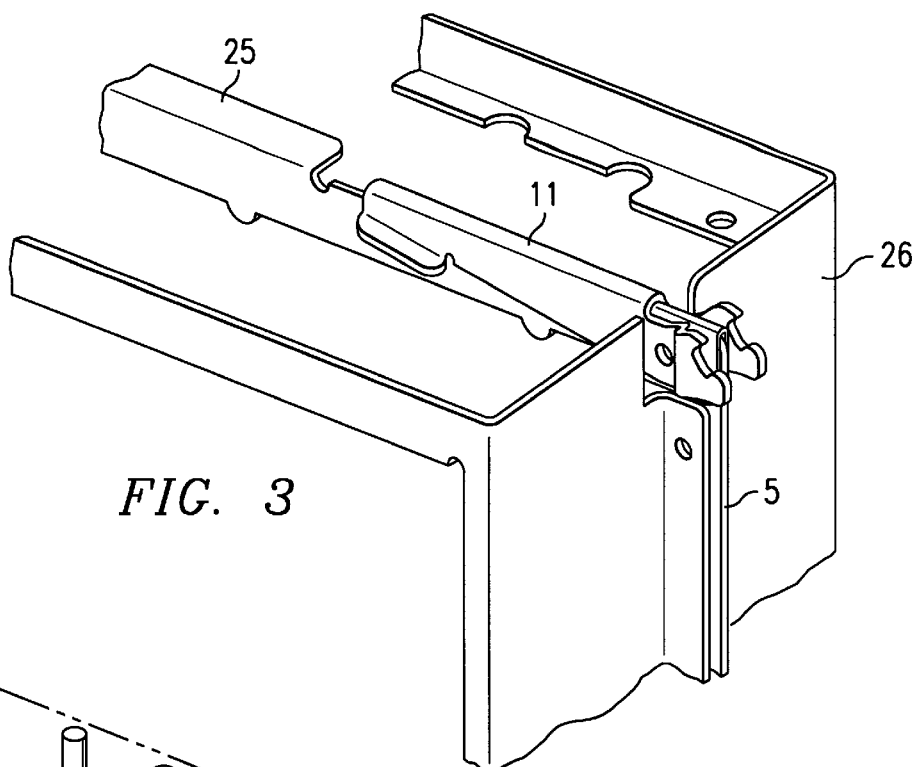
FIG. 3 is an enlarged perspective view of the alignment frame corner shown in FIG. 2a including the insertion-extraction handles.

FIG. 3 illustrates the insertion-extraction handles 11 that are disclosed in U.S. Pat. Nos. 5,506,758 and 5,502,622. The insertion-extraction handles 11 are levers that provide mechanical advantage for insertion and extraction of the field replaceable apparatus 1 (as shown in FIG. 1) in the computer system. The insertion-extraction handles 11 are attached to the alignment rim 25 and interlock with a clip such that they guide, position, and stabilize the sliding and positioning of the alignment frame 2 (as shown in FIG. 2a) and the alignment flange 5. They may be made of aluminum sheet metal or pre-plated cold rolled steel. The insertion-extraction handles 11 may be an integral part or an incremental part of the alignment rim 25. For instance they may incrementally snap on the wide end of the top of the alignment rim 25.

The insertion-extraction handles 11 may also provide mechanical advantage for installation and removal of the field replaceable apparatus 1 from the receiving apparatus 4 (as are shown in FIG. 1). More particularly, the insertion-extraction handles 11 provide mechanical advantage for the installation and removal of the CPU module 13 from the printed circuit board 15 (as are shown in FIG. 1). In the present embodiment as depicted the insertion-extraction handles 11 may provide a five-to-one mechanical advantage to overcome the force required to connect or remove the CPU module 13. Therefore, since there may be up to eighty pounds of force required for the connection or removal of the CPU module 13 from the printed circuit board 15, when each handle is operated with about ten pounds of force there is ample mechanical advantage to insert and extract the CPU module 13. Further, the insertion-extraction handles 11 eliminate the need for special tools which have often been required in the past, to install and remove the CPU module 13 from the printed circuit board 15.

In the present embodiment the insertion-extraction handles 11 may be levers that movably pivot in the direction corresponding to the insertion and extraction of the field replaceable apparatus 1 from the computer system. The insertion-extraction handles 11 consist of three separate pieces (not shown). Two of the pieces, an insertion-extraction handle unit and a retaining clip mount, are located on the alignment rim 25. The third piece consists of engagement surfaces that may be fabricated as part of the computer system chassis. The retaining clip is constructed to fit inside, and be retained by, the insertion-extraction handle unit to form a handle/clip assembly. This assembly then slides over the alignment rim 25 having both a clip interface and a pivot relief. Features on the retaining clip engage inside these reliefs and securely retain the handle/clip assembly on the alignment rim 25. Once installed on the alignment rim 25 the retaining clip serves to transfer forces from the handle to the alignment rim 25 when the field replaceable apparatus 1 is being inserted or extracted from the computer system. Further, the forces on the alignment rim 25 are transferred through the field replaceable apparatus 1 that includes the CPU module 13. The transference of force to the CPU module 13 thereby enables the field replaceable apparatus 1 to be easily installed and removed in the field.

Since the insertion and removal process in a customer environment is less intrusive when a self-contained modular apparatus is employed, the insertion and extraction capabilities that are fully contained within the field replaceable apparatus 1 improve its quality by reducing the risk of damage due to errors in handling.

FIG. 4a shows the field replaceable apparatus 1 and the printed circuit board 15 and includes the CPU module 13 that is attached to the printed circuit board 15 by the anchor screws 56. In one embodiment, the long anchor screws 56 enter the top of the field replaceable apparatus 1, extend through the length of the field replaceable apparatus 1, and are attached directly into the printed circuit board 15. To enable the direct attachment, the printed circuit board 15 may be bolstered by techniques well-known in the art and contain threads 61 that fit the anchor screws 56. The anchor screws 56 are also discussed with reference to FIG. 4b.

In an alternative embodiment the CPU module 13 may be circumscribed by the CPU module sleeve 21, which is discussed in relation to the invention disclosed in U.S. patent application Ser. No. 09/032359. Recall that the CPU module sleeve 21 is initially attached to the printed circuit board 15 thereby forming the receiving apparatus 4 (as shown in FIG. 1). Therefore, the anchor screws 56 that terminate at the anchor sockets 58 in the CPU module sleeve 21 (as shown in FIG. 4c) are secured to the receiving apparatus 4.

As further illustrated in FIG. 4a, the field replaceable apparatus 1 minimizes the distance between the power converter 17 and the CPU module 13 by having a stacked configuration of the CPU module 13, the isothermal plate 19, and the power converter 17; and by employing the isothermal plate slot 23 as a passageway to enable connection of the power connectors 32. Current computers require DC-to-DC power conversion from the primary power which is often supplied to the computer system through the printed circuit board 15. The primary power must be converted to the low voltage power required by the CPU module or other VLSI modules. Further, the access to and conversion of power require that the power connectors 32 are attached to the CPU module 13, the power converter 17, and the printed circuit board 15. The minimized distance between the power converter 17 and the CPU module 13 ensures optimal transmission of electric power due to the shortened associated power connectors 32. It will be appreciated that alternatively, the power converter 17 may transfer electric power directly to the printed circuit board 15, and the CPU module 13 may then obtain electric power from the printed circuit board 15.

The stacking of computer components also minimizes space on the printed circuit board 15. Further, the attachment of the isothermal plate 19 to the CPU module 13 is predetermined to orient the CPU module 13 for connection the printed circuit board 15 as discussed in the associated U.S. patent application Ser. No. 8/902,770.

The field replaceable apparatus 1 also includes a heat sink assembly 18 (as shown in FIG. 4b) that includes the isothermal plate 19, the heat pipes 31, and the heat fins 27. As is well known in the art, the isothermal plate 19 moves heat from the power converter 17, the CPU module 13, and the associated power connectors 32 by conduction. In the present embodiment, the heat pipes 31 transfer heat to the heat fins 27 in a manner well known in the art, and are attached to and supported by the alignment frame 2. For instance, the heat pipes 31 may be made of copper and contain water that undergoes a phase change when the evaporating end of the heat pipes 31 is heated. Thereby fluid vapor moves throughout the heat pipes 31 as heat is conducted from the isothermal plate 19 to the heat pipes 31. The ends of the heat pipes 31 are either the evaporating end (not shown) that gets hot, or the condensing end (not shown). The condensing end receives condensed liquid that is formed as the vapor is cooled. It will be appreciated that the heat pipes 31 may alternatively direct heat toward components in the computer system to maintain a proper operating temperature.

In the present embodiment, the heat fins 27 are located on top of the power converter 17 and also flank the power converter 17, thus creating a large area in thermal communication with the isothermal plate 19. The heat fins 27 therefore absorb and dissipate heat from the power converter 17, the CPU module 13, and the associated power connectors 32. For instance, air may be forced through the computer system by means such as a fan and, by convection, dissipate heat on the large area of the heat fins 27.

The field replaceable apparatus 1 includes the EMI sleeve 39, which is an inverted U-shape and fits around the power converter 17. The EMI sleeve 39 may be metal and advantageously attenuates EMI coming from the power converter 17, and the associated power connectors 32.

The alignment frame 2 includes the top plate 29, the pair of alignment brackets 26, and the alignment rim 25. The alignment brackets 26 and the alignment rim 25 form the alignment flange 5. Further, the insertion-extraction handles 11 are attached to the alignment rim 25.

The heat sink assembly 18 is illustrated in FIG. 4b and includes the isothermal plate 19, the heat fins 27, and the heat pipes 31. The heat pipes 31 may be inserted throughout a substantial portion of the length of the isothermal plate 19. Since the field replaceable apparatus 1 (as shown in FIG. 1) may be inverted in the computer system, the isothermal plate 19 may be either vertically above or below the heat pipes 31. Wicking is the well-known property of returning condensed liquid back to the evaporating end of the heat pipes 31. Dry out is a well-known constraint of inverted heat pipes 31 and occurs as gravity prevents the condensed liquid from wicking and completely returning to the evaporating end of the heat pipes 31. The dry out condition may render a portion of the heat pipes 31 non-functional and introduces a risk of loss of the conduction path in the heat pipes 31. Further, if a portion of the heat pipes 31 inside the isothermal plate 19 completely drys out the conduction path is impeded and heat transference is reduced. Also, if the entire portion of the heat pipes 31 inside the isothermal plate 19 completely drys out a sudden overheated condition of the CPU module 13 and the power converter 17 may ensue. In the present embodiment the heat pipes 31 extend well into the isothermal plate 19 providing extra conduction area, and therefore the claimed apparatus tolerates dry out, thus preventing the sudden thermal overheating condition.

As illustrated in FIG. 4c, the present embodiment includes a metal Faraday Cage 34 with a first EMI sub-cell 35 and a second EMI sub-cell 37. The first EMI sub-cell 35 shields EMI from the power converter 17 (as shown in FIG. 4a), and the associated power connectors 32. The first EMI sub-cell 35 includes the EMI sleeve 39, a portion of the alignment brackets 26, and the isothermal plate 19 including the isothermal plate slot 23. The second EMI subcell 37 shields EMI from the CPU module 13, and the associated power connectors 32. The second EMI sub-cell 37 includes the isothermal plate 19 with the isothermal plate slot 23, the CPU module sleeve 21, and the printed circuit board 15.

In the present embodiment a tight EMI seal between the first EMI sub-cell 35 and the second EMI sub-cell 37 is obtained by tightening the anchor screws 56 (as shown in FIG. 4a) that thread through the isothermal plate 19 into the anchor sockets 58 in the CPU module sleeve 21. Recall that the CPU module sleeve 21 is secured to the printed circuit board 15. Alternatively, the anchor screws 56 may be directly attached to the printed circuit board 15 (as shown in FIG. 4a).

Recall that the field replaceable apparatus 1 is tightly clamped to the printed circuit board 15 through the CPU module sleeve 21. Further, the CPU module sleeve 21 has an EMI groove 83 in both the face that abuts the CPU module 13 and the face that abuts the printed circuit board 15. As is well known in the art, by inserting a compliant, electrically conductive material in the EMI groove 83 a tight connection that attenuates EMI is made between the CPU module 13 and the CPU module sleeve 21, and the CPU module sleeve 21 and the printed circuit board 15. For example, the product marketed under the trademark CHOFORM™ is an electrically conductive, compliant caulk-like substance that may be dispensed on a base such as the EMI groove 83 to attenuate EMI. Alternatively, a ribbon of electrically conductive material such as a product marketed under the trademark SPIRA™ may be used in the EMI groove 83.

When the CPU module 13 includes a pin grid array (PGA), the pins may be protected during assembly by the CPU module sleeve 21. It will be appreciated that the CPU module sleeve 21 also operates with a land grid array (LGA) CPU module 13 or other technologies known or to be developed in the future.

It will be appreciated that the EMI groove 83 may be cut on the printed circuit board 15, as is well known in the art. Therefore, using an electrically compliant interface will also attenuate EMI by enabling a tight connection between the CPU module 13 and the printed circuit board 15 (as shown in FIG. 4a).

Figure 4D:
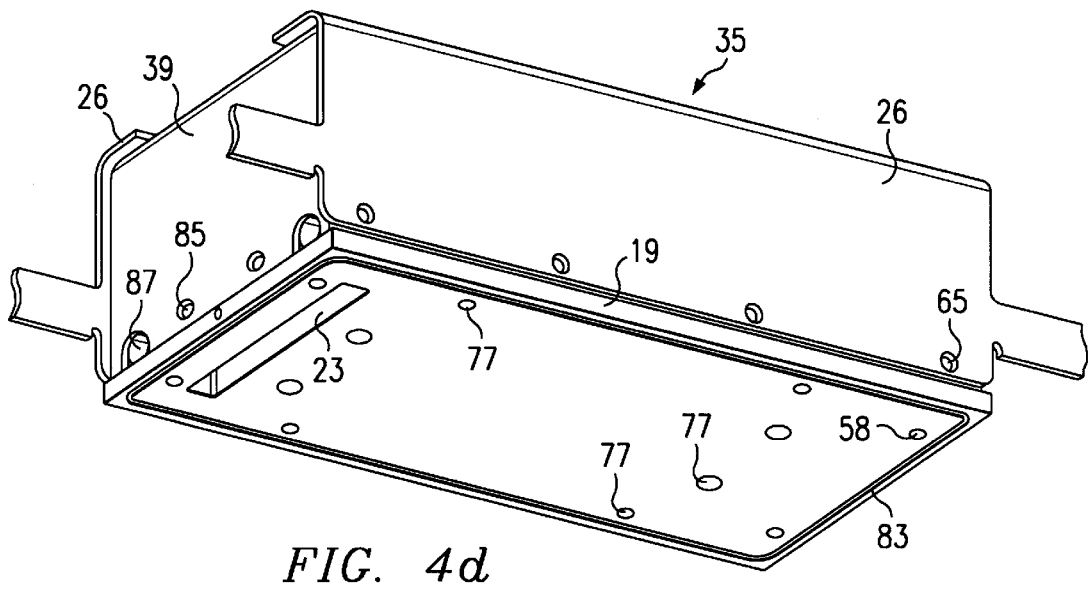
FIG. 4d is a view of the first EMI sub-cell.

FIG. 4d shows a view of the first EMI sub-cell 35. The present embodiment includes isothermal plate attachment screws (not shown) that insert into isothermal plate attachment sockets 77 to attach the power converter 17 (as shown in FIG. 4a) to the top of the isothermal plate 19 and the CPU module 13 (as shown in FIG. 4a) to the bottom of the isothermal plate 19. The power converter 17 is attached, with the isothermal plate screws that are set well into the isothermal plate 19, before the CPU module 13 is attached to the isothermal plate 19. The set-in attachment thereby ensures that the bottom of the isothermal plate 19 is flat and will accommodate the subsequent attachment of the CPU module 13 on the isothermal plate 19.

The present embodiment includes isothermal plate screws (not shown) that fit into isothermal plate sockets 85 on the shorter ends of the isothermal plate 19. The isothermal plate screws tightly attach the EMI sleeve 39 to the isothermal plate 19 thereby creating a tight EMI seal. The EMI sleeve 39 also includes heat pipe notches 87 that are channels for the heat pipes 31.

The bottom view of the isothermal plate 19 shows the anchor sockets 58 and the isothermal plate slot 23. The front view of the alignment bracket 26 shows the alignment frame sockets 65.

The isothermal plate 19 also may have the EMI groove 83. That is, a groove may be cut in the isothermal plate 19 and thereby enable the placement of electrically compliant material to enable a tight seal between the isothermal plate 19 and either the CPU module sleeve 21 or the printed circuit board 15. The tight seal will also attenuate EMI.

The present embodiment is a modular integrated apparatus and method that integrates interdependent electrical and mechanical functionality and that includes a CPU module attached to a printed circuit board, a power converter, and a plurality of associated electrical power connectors, such as power cables. Further, the field replaceable apparatus is an EMI enclosure and a heat management device. The modular integrated apparatus includes a field replaceable apparatus and a receiving apparatus.

By reducing the number of parts required to attach a CPU module, a power converter, and a printed circuit board while containing EMI and managing heat, the present embodiment improves the ease of use of a modular integrated apparatus. Further, integrating interdependent electrical and mechanical functionality improves the process of repairing and upgrading the CPU module and the power converter at a customer site by eliminating parts and simplifying the computer apparatus package. Additionally, by including the power converter and the CPU module in the field replaceable apparatus, the field replaceable apparatus may be tested prior to installation in the field to ensure it operates properly.

Although a specific embodiment of the invention has been described and illustrated, the invention is not to be limited to the specific forms or arrangement of parts so described and illustrated. Those skilled in the art will recognize that changes may be made in form and detail without departing from the scope of the invention. The invention is limited only by the claims.

I claim:

1. A modular integrated apparatus for a computer system having primary electric power and a printed circuit board, said modular integrated apparatus comprising;

a CPU module operably connected to said printed circuit board at a pre-determined location;

a power converter for transforming said primary electric power into a form suitable for said CPU module, said power converter having at least one input electric power connection for connection to and transmission of said primary electric power, and at least one output electric power connection for connection to and transmission of said transformed electric power;

an isothermal plate physically attached to said CPU module and to said power converter for managing heat in said computer system; and an alignment frame attached to said isothermal plate at a pre-determined location for aligning the relative positions of said CPU module, said power converter, and said isothermal plate to said computer system, thereby causing said modular integrated apparatus to be operably connected to said computer system.

2. A modular integrated apparatus for a computer system having primary electric power and a printed circuit board, said modular integrated apparatus comprising;
  a field replaceable apparatus having;
    a CPU module operably connected to said printed circuit board at a predetermined location;
    a power converter for transforming said primary electric power into a form suitable for said CPU module, said power converter having at least one input electric power connection for transmission of said primary electric power, and at least one output electric power connection for transmission of said transformed electric power;
    an isothermal plate physically attached to said CPU module and to said power converter for managing heat in said computer system; and
    an alignment frame attached to said isothermal plate at a pre-determined location facilitating insertion and removal of said field replaceable apparatus from and to said computer system and for aligning the relative positions of said CPU module, said power converter, and said isothermal plate to said computer system, thereby causing said modular integrated apparatus to be operably connected to said computer system;
  a receiving apparatus having;
    a CPU module sleeve between said printed circuit board and said CPU module, wherein said CPU module sleeve aligns said CPU module to said printed circuit board for operable connection of said CPU module to said computer system; and
    said printed circuit board being attached to said CPU module sleeve; and
  said receiving apparatus being attached to said field replaceable apparatus for forming said modular integrated apparatus.

3. A modular integrated apparatus as set forth in claim 2, further comprising at least one insertion-extraction handle that attaches to said alignment frame and that movably pivots to insert said field replaceable apparatus from and to said computer system.

4. A modular integrated apparatus as set forth in claim 2, said field replaceable apparatus further comprising a heat management device having at least one heat pipe attached to said isothermal plate thereby diverting heat away from said isothermal plate.

5. A modular integrated apparatus as set forth in claim 2, said field replaceable apparatus further comprising a heat management device including at least one heat pipe attached to said isothermal plate thereby directing heat toward said isothermal plate.

6. A modular integrated apparatus as set forth in claim 2, said field replaceable apparatus further comprising a heat management device including at least one heat fin located adjacent to said power converter and said isothermal plate, thereby said heat fin absorbs heat from said isothermal plate.

7. A modular integrated apparatus as set forth in claim 4, said heat management device having at least one heat fin located adjacent to said power converter and said isothermal plate, thereby said heat fin absorbs heat away from said isothermal plate and said heat pipes.

8. A modular integrated apparatus as set forth in claim 4, wherein said heat pipe extends into said isothermal plate for eliminating dry out of said isothermal plate.

9. A modular integrated apparatus as set forth in claim 2, wherein said isothermal plate includes an isothermal plate slot forming a passageway for said input electric power connection and said output electric power connection, for facilitating transmission of said primary electric power and said transformed electric power.

10. A modular integrated apparatus as set forth in claim 2, wherein said alignment frame includes;
  a top plate that is the top of said alignment frame;
  a pair of alignment brackets that surround said isothermal plate and said power converter; and
  an alignment rim that is between said alignment brackets for forming an alignment flange, and locating said alignment flange at a pre-determined location for facilitating insertion and removal of said field replaceable apparatus from and to said computer system.

11. A modular integrated apparatus as set forth in claim 10, wherein said alignment rim includes a handle for facilitating insertion and removal of said field replaceable apparatus from and to said computer system.

12. A modular integrated apparatus as set forth in claim 10, wherein said alignment rim includes at least one tab for aligning said alignment rim with said top plate.

13. A modular integrated apparatus as set forth in claim 10, wherein said alignment frame includes at least one EMI screw that attaches to said pair of alignment brackets for tightening said alignment frame and for attenuating EMI.

14. A modular integrated apparatus as set forth in claim 10, wherein said alignment frame includes at least one anchor screw that enters said top plate, that extends throughout said field replaceable apparatus, and that is secured into said printed circuit board, for attenuating EMI.

15. A modular integrated apparatus as set forth in claim 10, wherein said alignment frame includes at least one anchor screw that enters said top plate, that extends throughout said field replaceable apparatus, and that is secured into said CPU module sleeve, for attenuating EMI.

16. A modular integrated apparatus as set forth in claim 2, further comprising an EMI containment enclosure having;
  an EMI sleeve that fits over said power converter and that is attached to said isothermal plate, for attenuating EMI from said power converter;
  a first EMI sub-cell having said EMI sleeve, said alignment frame, and said isothermal plate and that encloses said power converter, said input electric power connection, and said output electric power connection; for attenuating EMI from said power converter, said input electric power connection, and said output electric power connection;
  a second EMI sub-cell having said isothermal plate, said CPU module sleeve, and said printed circuit board and that encloses said CPU module, said input electric power connection, and said output electric power connection; for attenuating EMI from said CPU module, said input electric power connection, and said output electric power connection; and
  said first EMI sub-cell and said second EMI sub-cell being connected via a shared slot in said isothermal plate for attenuation of EMI.

17. A modular integrated apparatus as set forth in claim 16, wherein said isothermal plate includes at least one isothermal plate screw that securely attaches said EMI sleeve to said isothermal plate for attenuating EMI.

18. A field replaceable apparatus for a computer system, said computer system having primary electric power and a printed circuit board, said field replaceable apparatus comprising;

a CPU module for connection to said printed circuit board at a pre-determined location;

a power converter for transforming said primary electric power into a form suitable for said CPU module, said power converter having at least one input electric power connection for transmission of said primary electric power, and at least one output electric power connection for transmission of said transformed electric power;

an isothermal plate physically attached to said CPU module and to said power converter for managing heat in said computer system; and an alignment frame attached to said isothermal plate at a pre-determined location facilitating insertion and removal of said field replaceable apparatus from and to said computer system and for aligning the relative positions of said CPU module, said power converter, and said isothermal plate to said computer system, thereby causing said modular integrated apparatus to be operably connected to said computer system.

19. A modular integrated apparatus for a computer system; said computer system having primary electric power and a printed circuit board, said modular integrated apparatus comprising;

a field replaceable apparatus having;
  a CPU module operably connected to said printed circuit board at a predetermined location;
  a power converter for transforming said primary electric power into a form suitable for said CPU module, said power converter having at least one input electric power connection for transmission of said primary electric power and at least one output electric power connection for transmission of said transformed electric power;
  a heat management device, having;
    an isothermal plate physically attached to said CPU module and to said power converter for managing heat in said computer system;
    an isothermal plate slot in said isothermal plate forming a passageway for said input electric power connection and for said output electric power connection, for facilitating transmission of said primary electric power and said transformed electric power;
    at least one heat pipe being attached to said isothermal plate for diverting heat away from said isothermal plate; and
    at least one heat fin located adjacent to said power converter and said isothermal plate for absorbing heat from said isothermal plate and said heat pipes; and
  an alignment frame attached to said isothermal plate at a pre-determined location for aligning the relative positions of said CPU module, said power converter, and said isothermal plate to said computer system, thereby causing said modular integrated apparatus to be operably connected to said computer system, said alignment frame having;
    a top plate that is the top of said alignment frame;
    a pair of alignment brackets that surround said isothermal plate and said power converter; and
    an alignment rim that is between said alignment brackets for forming an alignment flange, and locating said alignment flange at a pre-determined location for facilitating insertion and removal of said field replaceable apparatus from and to said computer system;

a receiving apparatus having;
  a CPU module sleeve between said printed circuit board and said CPU module, wherein said CPU module sleeve aligns said CPU module to said printed circuit board for operable connection of said CPU module to said computer system; and
  said printed circuit board being attached to said CPU module sleeve; and
  said field replaceable apparatus and said receiving apparatus being attached, for forming said modular integrated apparatus.

20. A method for creating a modular integrated apparatus for a computer system having primary electric power and a printed circuit board, said method comprising;
  connecting a CPU module to said printed circuit board at a pre-determined location;
  including a power converter for transforming said primary electric power into a form suitable for said CPU module, transmitting said primary electric power by at least one input electric power connection, and transmitting said transformed electric power by at least one output electric power connection;
  attaching an isothermal plate to said CPU module and to said power converter, for managing heat in said computer system; and
  attaching an alignment frame to said isothermal plate at a pre-determined location for aligning the relative positions of said CPU module, said power converter, and said isothermal plate to said computer system, thereby causing said modular integrated apparatus to be operably connected to said computer system.

21. A method for creating a modular integrated apparatus for a computer system having primary electric power and a printed circuit board, said method comprising;
  including a field replaceable apparatus having the following steps;
    connecting a CPU module to said printed circuit board at a pre-determined location;
    including a power converter for transforming said primary electric power into a form suitable for said CPU module, transmitting said primary electric power by at least one input electric power connection, and transmitting said transformed electric power by at least one output electric power connection;
    attaching an isothermal plate to said CPU module and to said power converter for managing heat in said computer system; and
    attaching an alignment frame to said isothermal plate at a pre-determined location facilitating insertion and removal of said field replaceable apparatus from and to said computer system and for aligning the relative positions of said CPU module, said power converter, and said isothermal plate to said computer system, thereby causing said field replaceable apparatus to be operably connected to said computer system;
  including a receiving apparatus having the following steps;
    including a CPU module sleeve located between said printed circuit board and said CPU module that aligns said CPU module to said printed circuit board for operable connection of said CPU module to said computer system; and
    including said printed circuit board being attached to CPU module sleeve; and
  attaching said field replaceable apparatus to said receiving apparatus for forming said modular integrated apparatus.

22. A method as set forth in claim 20, wherein said attaching an alignment frame step includes;
- including a top plate of said alignment frame;
- surrounding said isothermal plate and said power converter with a pair of alignment brackets; and
- including an alignment rim between said alignment brackets for forming an alignment flange, and locating said alignment flange at a pre-determined location for facilitating insertion and removal of said field replaceable apparatus from and to said computer system.

23. A method as set forth in claim 20 further comprising, establishing a heat management device, including the following steps;
- including an isothermal plate slot in said isothermal plate forming a passageway for said input electric power connection and for said output electric power connection, for facilitating transmission of said primary electric power and said transformed electric power;
- attaching at least one heat pipe to said isothermal plate for diverting heat away from said isothermal plate; and
- positioning at least one heat fin adjacent to said power converter and said isothermal plate for absorbing heat from said isothermal plate and said heat pipes.

24. A method as set forth in claim 21 further comprising, establishing an EMI containment enclosure having the following steps;
- fitting an EMI sleeve over said power converter and attaching said EMI sleeve to said isothermal plate, for attenuating EMI;
- establishing a first EMI sub-cell by including said EMI sleeve, said alignment frame, and said isothermal plate that encloses said power converter, said input electric power connection, and said output electric power connection, for attenuating EMI from said power converter, said input electric power connection, and said output electric power connection;
- establishing a second EMI sub-cell by including said isothermal plate, said CPU module sleeve, and said printed circuit board that encloses said CPU module, said input electric power connection, and said output electric power connection, for attenuating EMI from said CPU module, said input electric power connection, and said output electric power connection; and
- connecting said first EMI sub-cell and said second EMI sub-cell via a shared slot in said isothermal plate for attenuating EMI.

25. A modular integrated apparatus for a computer system having primary electric power and a printed circuit board, said field replaceable apparatus comprising;
- a CPU module operably connected to said printed circuit board at a pre-determined location;
- a power converter having at least one input electric connection and at least one output electric power connection;
- an isothermal plate attached to said CPU module and said power converter;
- an alignment frame attached to said isothermal plate;
- means for transmitting said primary electric power to said power converter;
- means for transforming and transmitting said primary electric power into a form suitable for said CPU module so that said CPU module suitably executes in said computer system;
- means for managing heat in said computer system; and
- means for aligning the relative positions of said CPU module, said power converter, and said isothermal plate to said computer system so that said modular integrated apparatus is operably connected to said computer system.

26. A modular integrated apparatus for a computer system having primary electric power and a printed circuit board, said field replaceable apparatus comprising;
- a field replaceable apparatus having;
    - a CPU module operably connected to said printed circuit board at a predetermined location;
    - a power converter having at least one input electric connection and at least one output electric power connection;
    - an isothermal plate attached to said CPU module and said power converter;
    - an alignment frame attached to said isothermal plate;
- a receiving apparatus having;
    - a CPU module sleeve between said printed circuit board and said CPU module; and
    - said printed circuit board attached to said CPU module sleeve;
- means for transmitting said primary electric power to said power converter;
- means for transforming and transmitting said primary electric power into a form suitable for said CPU module so that said CPU module suitably executes in said computer system;
- means for managing heat in said computer system;
- means for aligning the relative positions of said CPU module, said power converter, and said isothermal plate to said computer system so that said modular integrated apparatus is operably connected to said computer system;
- means for facilitating insertion and removal of said field replaceable apparatus from and to said computer system;
- means for aligning said CPU module to said printed circuit board for operable connection of said CPU module to said computer system; and
- means for attaching said field replaceable apparatus and said receiving apparatus for forming said modular integrated apparatus.

27. A field replaceable apparatus for a computer system as set forth in claim 26, said alignment frame further having;
- a top plate of said alignment frame;
- a pair of alignment brackets that surround said isothermal plate and said power converter;
- an alignment rim between said pair of alignment brackets for forming an alignment flange; and
- means for locating said alignment flange so that insertion and removal of said field replaceable apparatus from and to said computer system is facilitated.

28. An field replaceable apparatus as set forth in claim 26 further comprising;
- a heat management device, having;
    - an isothermal plate slot in said isothermal plate;
    - at least one heat pipe attached to said isothermal plate;
    - at least one heat fin located adjacent to said isothermal plate and said power converter;
    - means for creating said passageway in said isothermal plate slot so that said transformed electric power is connected from said power converter to said CPU module;
    - means for diverting heat from said isothermal plate; and means for absorbing heat from said isothermal plate and said heat pipes.

29. A modular integrated apparatus as set forth in claim 25, further comprising;
an EMI sleeve that covers said power converter and that is attached to said isothermal plate;
an isothermal plate slot in said isothermal plate;
a first EMI sub-cell including said EMI sleeve, said alignment frame, and said isothermal plate;
a second EMI sub-cell including said isothermal plate, said CPU module sleeve, and said printed circuit board;

means for enclosing said first EMI sub-cell around said power converter, said input electric power connection, and said output electric power connection so that EMI is shielded;
means for enclosing said CPU module, said input electric power connection, and said output electric power connection so that EMI is shielded; and
means for connecting said first EMI sub-cell and said second EMI sub-cell via said isothermal plate slot so that EMI is attenuated.

* * * * *